United States Patent
Miyazawa

(10) Patent No.: US 9,417,271 B2
(45) Date of Patent: Aug. 16, 2016

(54) VOLTAGE DETECTION DEVICE

(71) Applicant: ALPS ELECTRIC CO., LTD., Tokyo (JP)

(72) Inventor: Akira Miyazawa, Miyagi-Ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 207 days.

(21) Appl. No.: 14/485,229

(22) Filed: Sep. 12, 2014

(65) Prior Publication Data

US 2015/0077089 A1    Mar. 19, 2015

(30) Foreign Application Priority Data

Sep. 13, 2013  (JP) ................................ 2013-190486

(51) Int. Cl.
| | | |
|---|---|---|
| *G01R 31/40* | (2014.01) | |
| *G01R 19/00* | (2006.01) | |
| *G01R 19/165* | (2006.01) | |
| *B60L 11/18* | (2006.01) | |

(52) U.S. Cl.
CPC ....... *G01R 19/16542* (2013.01); *B60L 11/1851* (2013.01)

(58) Field of Classification Search
CPC .......... G01R 19/16542; G01R 19/165; G01R 19/16533; G01R 19/16538; G01R 19/16547; G01R 19/16552; G01R 19/0084; G01R 31/36; G01R 31/3606; G01R 31/362; B60L 11/1851; B60L 11/1861; B60L 11/1862
See application file for complete search history.

(56) References Cited

U.S. PATENT DOCUMENTS

| | | | | |
|---|---|---|---|---|
| 4,020,414 A * | 4/1977 | Paredes | ................. | G01R 15/04 320/136 |
| 4,413,234 A * | 11/1983 | Lupoli | ............. | G01R 19/16542 320/DIG. 21 |
| 4,990,885 A * | 2/1991 | Irick | ..................... | H02J 7/1423 320/110 |
| 5,629,642 A * | 5/1997 | Yoshimura | ....... | G01R 19/16552 327/142 |
| 5,798,629 A * | 8/1998 | Terauchi | ............ | G01R 31/3648 320/106 |
| 6,549,014 B1 * | 4/2003 | Kutkut | .................. | G01R 1/203 320/132 |
| 2007/0090801 A1 * | 4/2007 | Kim | ..................... | G01R 31/362 320/128 |
| 2007/0096771 A1 * | 5/2007 | Sugano | ............ | G01R 19/16552 327/77 |

FOREIGN PATENT DOCUMENTS

JP    2000-206215 A    7/2000

* cited by examiner

*Primary Examiner* — Tung X Nguyen
*Assistant Examiner* — David Frederiksen
(74) *Attorney, Agent, or Firm* — Brinks Gilson & Lione

(57) ABSTRACT

A voltage detection device that detects a decrease in an output voltage of a power supply device, includes a first voltage-dividing circuit that divides the output voltage of the power supply device, a first constant-voltage circuit that converts the output voltage of the power supply device into a predetermined voltage, a second constant-voltage circuit that converts the output voltage of the power supply device into a predetermined voltage lower than an output voltage of the first constant-voltage circuit, a comparator that receives output voltages of the first voltage-dividing circuit and the second constant-voltage circuit, and a detection circuit that detects the decrease in the output voltage of the power supply device. The detection circuit detects a decrease in the output voltage in a higher-voltage region, and detects a decrease in the output voltage in a lower-voltage region.

2 Claims, 8 Drawing Sheets

VOLTAGE DETECTION DEVICE

CLAIM OF PRIORITY

This application claims benefit of priority to Japanese Patent Application No. 2013-190486 filed on Sep. 13, 2013, which is hereby incorporated by reference in its entirety.

BACKGROUND

1. Field of the Disclosure

The present disclosure relates to a voltage detection device that is mounted on a vehicle and detects a decrease in an output voltage of a power supply device of the vehicle.

2. Description of the Related Art

Recently key-less entry systems include an in-vehicle communication device that is mounted on a vehicle and a portable device capable of wireless communication with the in-vehicle communication device. With such systems, vehicle operations, such as locking and unlocking of vehicle doors, may be performed by using a wireless communication between' the in-vehicle communication device and the portable device without using a mechanical key. The key-less entry system often has an immobilizer function in which permission or non-permission for starting the engine with a mechanical key is determined by performing verification of ID information by using wireless communication between the in-vehicle communication device and the portable device, in addition to the key-less function in which vehicle operations, such as locking and unlocking of vehicle doors, are performed without using a mechanical key.

Furthermore, in recent years, in accordance with an increase in the number of in-vehicle electronic devices mounted on a vehicle, dissemination of vehicles having an idling stop function, and the like, a case where the remaining amount of a battery (power supply device) decreases frequently occurs. Some in-vehicle electronic devices including the in-vehicle communication device of the key-less entry system operate even while the engine is turned off. Therefore, if a vehicle is left unattended for a long period of time with the engine turned off when the remaining amount of the battery is decreasing, an output voltage of the battery will decrease. Moreover, when a cranking operation (an operation to rotate the engine with a motor for starting the engine) is performed to start the engine while the remaining amount of the battery is decreasing, high power is used to actuate the motor for starting the engine. Therefore, the output voltage of the battery may decrease even further. When the output voltage of the battery is decreased, a circuit of the in-vehicle communication device may not operate properly, and may generate a defect in the operation of the key-less entry system.

Therefore, there is an increase in demand for a key-less entry system capable of avoiding defective operation of the system even in the case where the remaining amount of the battery decreases and the output voltage of the battery largely decreases. As a measure to avoid such a defect, providing a voltage detection device that detects the output voltage of the battery and employing a method for temporarily stopping a function of the key-less entry system before a circuit of the in-vehicle communication device stops operating properly in the case where the output voltage of the battery decreases, is effective.

As a technique related to the voltage detection device, for example, a device such as a power diagnostic device for a vehicle according to Japanese Unexamined Patent Application Publication No. 2000-206215 has been proposed. FIG. 7 is an explanatory diagram illustrating a configuration of a power diagnostic device for a vehicle 201 according to Japanese Unexamined Patent Application Publication No. 2000-206215. As illustrated in FIG. 7, the power diagnostic device for a vehicle 201 includes current detection means 203, terminal voltage detection means 204 (voltage detection device), abnormality determination means 206, current limitation means 207, abnormality warning means 208, a battery 202 (power supply device), an ignition switch 209, a back-up power supply 210, and a power generator 211.

The current detection means 203 detects a current flowing through an electronic device that is connected to the battery 202. The terminal voltage detection means 204 detects a terminal voltage of the battery 202 while the ignition switch 209 is turned off. When the terminal voltage of the battery 202 is at or below a specific value, the abnormality determination means 206 determines that abnormality has occurred. When the abnormality determination means 206 determines that abnormality has occurred, the current limitation means 207 limits on the current flowing through the electronic device, and the abnormality warning means 208 issues a warning.

Japanese Unexamined Patent Application Publication No. 2000-206215 does not mention stopping of a function of the key-less entry system. However, by using the above-mentioned technique, it is possible to detect the output voltage of the battery and to stop a function of the key-less entry system at an appropriate timing, when the output voltage of the battery decreases.

Furthermore, Japanese Unexamined Patent Application Publication No. 2000-206215 does not disclose a particular circuit configuration of the terminal voltage detection means 204 (voltage detection device). However, for example, a device having a circuit configuration similar to a conventional voltage detection device 310 illustrated in FIG. 8 may be used as the terminal voltage detection means 204. FIG. 8 is an explanatory diagram illustrating the circuit configuration of the voltage detection device 310.

As illustrated in FIG. 8, the voltage detection device 310 includes a voltage-dividing circuit 311, a constant-voltage circuit 312, and a detection circuit 313. Furthermore, the voltage detection device 310 is connected to a battery 320 (power supply device) and a control device 330. The battery 320 is a device equivalent to the battery 202 of the power diagnostic device for a vehicle 201 according to Japanese Unexamined Patent Application Publication No. 2000-206215. The control device 330 is a circuit equivalent to the abnormality determination means 206 of the power diagnostic device for a vehicle 201 according to Japanese Unexamined Patent Application Publication No. 2000-206215.

The voltage-dividing circuit 311 divides an output voltage VB of the battery 320 with a predetermined ratio. The voltage-dividing circuit 311 includes a resistive element R31 and a resistive element R32 that are connected in series in such a manner that the resistive element R31 and the resistive element R32 are in a predetermined voltage-dividing ratio. A connection point of the resistive element R31 and the resistive element R32 is an output terminal of the voltage-dividing circuit 311. A ground capacitance C31 is connected to the output terminal of the voltage-dividing circuit 311. The ground capacitance C31 is a capacitance to eliminate noise. An output voltage V1 of the voltage-dividing circuit 311 varies in proportion to the output voltage VB of the battery 320. The constant-voltage circuit 312 converts the output voltage VB of the battery 320 into a predetermined voltage V2. A circuit including a regulator IC or the like may be used as the constant-voltage circuit 312.

The output voltage V1 of the voltage-dividing circuit 311 and the output voltage V2 of the constant-voltage circuit 312 are input to the detection circuit 313. The output voltage V2 of the constant-voltage circuit 312 is used as a power-supply voltage Vcc and a reference voltage Vref of the detection circuit 313. Furthermore, based on the output voltage V1 of the voltage-dividing circuit 311 and the reference voltage Vref, the detection circuit 313 estimates the output voltage VB of the battery 320, and detects a decrease in the output voltage VB of the battery 320. Information regarding the decrease in the output voltage VB of the battery 320 is transmitted from the detection circuit 313 to the control device 330. Then, when the output voltage VB of the battery 320 decreases and reaches a specific value or less, the control device 330 determines that abnormality has occurred.

In the conventional voltage detection device 310, the decrease in the output voltage of the battery 320 is detectable if the decrease in the output voltage of the battery 320 is within a specific range. However, if the remaining amount of the battery 320 largely decreases and the output voltage of the battery 320 decreases to a value near the reference voltage Vref, the constant-voltage circuit 312 is not able to maintain a specific output voltage, thus outputting a voltage that is lower than the original reference voltage Vref.

As a result, the detection circuit 313 starts to estimate the output voltage of the battery 320 based on the voltage that is lower than the reference voltage Vref. Therefore, the decrease in the output voltage of the battery 320 cannot be detected correctly. Furthermore, for example, a case may occur in which the control device 330 determines that the output voltage of the battery 320 is higher than a specific value, even when the output voltage of the battery 320 has actually reached the specific value or less. In such a case, it is not possible to stop a function of the key-less entry system at an appropriate timing, when the output voltage of the battery 320 decreases, and therefore there is a possibility of generating a defect in an operation of the system.

The present invention has been made in view of the circumstances of such a related art, and provides a voltage detection device capable of detecting a decrease in an output voltage of a power supply device, even in the case where the output voltage of the power supply device largely decreases.

SUMMARY

According to an aspect of the present invention, a voltage detection device configured to be connected to a power supply device of a vehicle and to detect a decrease in an output voltage of the power supply device, includes a first voltage-dividing circuit configured to divide the output voltage of the power supply device with a predetermined ratio; a first constant-voltage circuit configured to convert the output voltage of the power supply device into a predetermined voltage; a second constant-voltage circuit configured to convert the output voltage of the power supply device into a predetermined voltage which is lower than an output voltage of the first constant-voltage circuit; a comparator configured to receive an output voltage of the first voltage-dividing circuit and an output voltage of the second constant-voltage circuit; and a detection circuit configured to receive the output voltage of the first voltage-dividing circuit, the output voltage of the first constant-voltage circuit, and an output voltage of the comparator and to detect the decrease in the output voltage of the power supply device. The detection circuit detects a decrease in the output voltage of the power supply device in a higher-voltage region of a detection voltage range of the detection circuit, based on the output voltage of the first voltage-dividing circuit and the output voltage of the first constant-voltage circuit. The detection circuit detects a decrease in the output voltage of the power supply device in a lower-voltage region of the detection voltage range of the detection circuit, based on the output voltage of the comparator.

DESCRIPTION OF THE EXEMPLARY EMBODIMENTS

Figure 1:
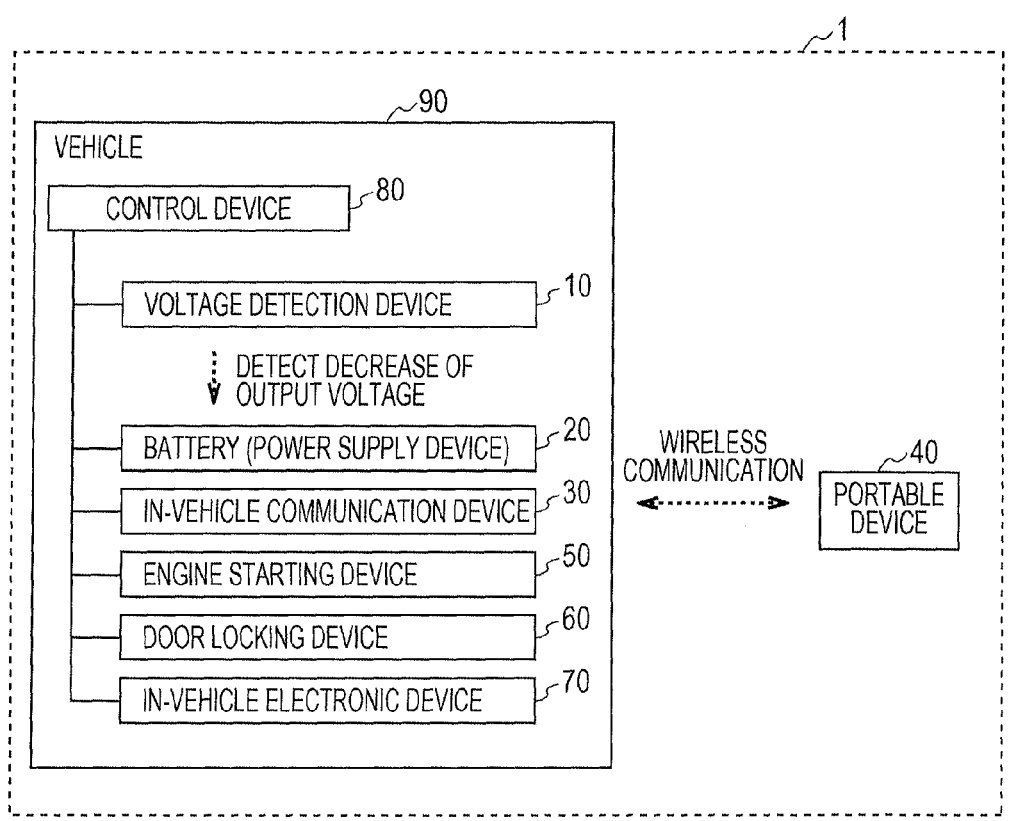
FIG. 1 is an explanatory diagram illustrating a configuration of a key-less entry system according to a first embodiment of the present invention.
Figure 2:
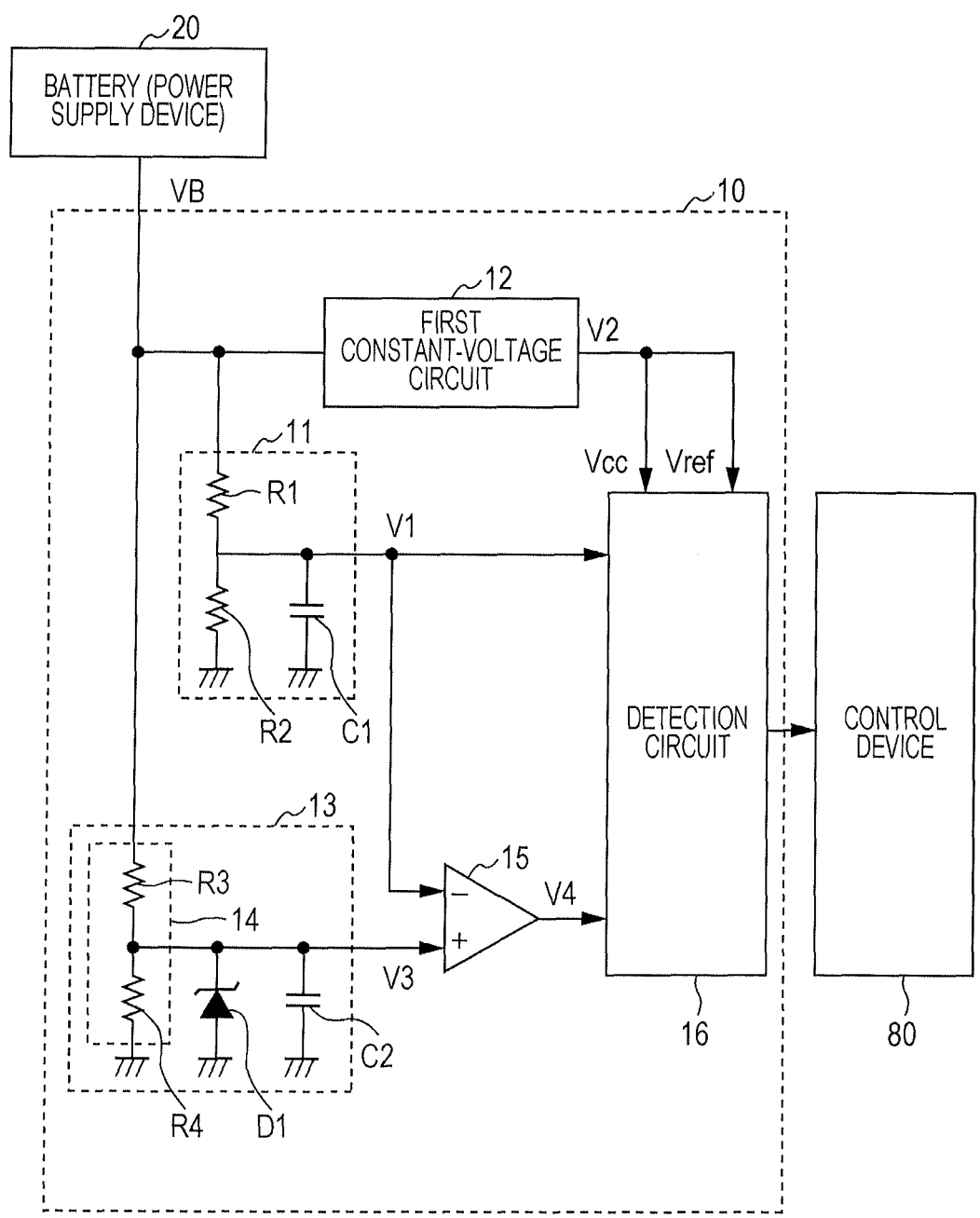
FIG. 2 is a circuit diagram illustrating a configuration of a voltage detection device illustrated in FIG. 1.

Hereinafter, a first embodiment of the present invention will be described with reference to the accompanying drawings. Firstly, a configuration of a voltage detection device 10 according to the first embodiment will be described with reference to FIG. 1 and FIG. 2. FIG. 1 is an explanatory diagram illustrating a configuration of a key-less entry system 1 according to the first embodiment of the present invention. FIG. 2 is a circuit diagram illustrating a configuration of the voltage detection device 10 illustrated in FIG. 1.

As illustrated in FIG. 1, the voltage detection device 10 is mounted on a vehicle 90, which includes the key-less entry system 1. The key-less entry system 1 includes a battery 20 (power supply device) that supplies power to various devices of the vehicle 90, an in-vehicle communication device 30 that is mounted on the vehicle 90, a portable device 40 that is capable of wireless communication with the in-vehicle communication device 30, an engine starting device 50 that starts and stops the engine, a door locking device 60 that locks and unlocks doors, an in-vehicle electronic device 70 including an air-conditioning device, a window opening/closing device, and a navigation device, and a control device 80 that controls various devices of the vehicle 90. Furthermore, in the key-less entry system 1, by using the wireless communication between the in-vehicle communication device 30 and the portable device 40, it is possible to perform vehicle operations such as locking and unlocking of doors of the vehicle 90 and starting and stopping of the engine of the vehicle 90, without using a mechanical key.

The voltage detection device 10, as illustrated in FIG. 2, is connected to the battery 20, and detects a decrease in an output voltage VB of the battery 20. Furthermore, the voltage detection device 10 includes a first voltage-dividing circuit 11, a first constant-voltage circuit 12, a second constant-voltage circuit 13, a comparator 15, and a detection circuit 16.

The first voltage dividing circuit 11 divides the output voltage VB of the battery 20 with a predetermined ratio. The first voltage-dividing circuit 11 includes a resistive element R1 and a resistive element R2 that are connected in series in such a manner that the resistive element R1 and the resistive element R2 are in a predetermined voltage-dividing ratio, and the connection point of the resistive element R1 and the resistive element R2 is an output terminal of the first voltage-dividing circuit 11. An output voltage V1 of the first voltage-dividing circuit 11 varies in proportion to the output voltage VB of the battery 20. A ground capacitance C1 is connected to the output terminal of the first voltage-divining circuit 11. The ground capacitance C1 is a capacitance to eliminate noise.

The first constant-voltage circuit 12 converts the output voltage VB of the battery 20 into a predetermined voltage V2. A circuit including a regulator IC or the like may be used as the first constant-voltage circuit 12. The output voltage V2 of the first constant-voltage circuit 12 is used as a power-supply voltage Vcc and a reference voltage Vref of the detection circuit 16.

The second constant-voltage circuit 13 converts the output voltage VB of the battery 20 into a predetermined voltage V3, which is lower than the output voltage V2 of the first constant-voltage circuit 12. The second constant-voltage circuit 13 may include a second voltage-dividing circuit 14, a Zener diode D1, and a ground capacitance C2. The second voltage-dividing circuit 14 divides the output voltage VB of the battery 20 with a predetermined ratio. The second voltage-dividing circuit 14 includes a resistive element R3 and a resistive element R4 that are connected in series in such a manner that the resistive element R3 and the resistive element R4 are in a predetermined voltage-dividing ratio, and the connection point of the resistive element R3 and the resistive element R4 is an output terminal of the second constant-voltage circuit 13.

The cathode side of the Zener diode D1 is connected to the output terminal of the second constant-voltage circuit 13, and the anode side of the Zener diode D1 is grounded. Furthermore, the Zener diode D1 operates in such a manner that the voltage of the output terminal of the second constant-voltage circuit 13 is equal to the voltage V3. The ground capacitance C2 is connected to the output terminal of the second constant-voltage circuit 13. The ground capacitance C2 is a capacitance to eliminate noise. The output voltage V3 of the second constant-voltage circuit 13 is used as a comparison voltage for the comparator 15.

The comparator 15 compares the output voltage V1 of the first voltage-dividing circuit 11 with the output voltage V3 of the second constant-voltage circuit 13. A circuit including a comparator IC or the like is used as the comparator 15. The output voltage V1 of the first voltage-dividing circuit 11 and the output voltage V3 of the second constant-voltage circuit 13 are input to the comparator 15. Furthermore, when the output voltage V1 of the first voltage-dividing circuit 11 is lower than or equal to the output voltage V2 of the second constant-voltage circuit 13, an output voltage V4 of the comparator 15 exhibits a predetermined voltage value. When the output voltage V1 of circuit 16 detects a decrease in the output voltage of the battery 20 in the first voltage range of the detection voltage range, based on the output voltage V1 of the first voltage-dividing circuit 11 and the reference voltage Vref. Furthermore, the detection circuit 16 detects a decrease in the output voltage VB of the battery 20 in the second voltage range of the detection voltage range, based on the output voltage V4 of the comparator 15.

Hereinafter, a description will be provided on the assumption that a voltage range in which a decrease in the output voltage VB of the battery 20 is very small and the various devices connected to the battery 20 thus operate properly is referred to as a normal operation range, a threshold for the normal operation range and the first voltage range is referred to as a first threshold VB1, and a threshold for the first voltage range and the second voltage range is referred to as a second threshold VB2. The normal operation range is a voltage range higher than the first threshold VB1. The first voltage range is a voltage range lower than or equal to the first threshold VB1 and higher than the second threshold VB2. The second voltage range is a voltage range lower than or equal to the second threshold VB2. The values of the first threshold VB1 and the second threshold VB2 are appropriately set correspondingly to functions of the key-less entry system 1 and standards of the devices.

Next, a method for detecting a decrease in the output voltage VB of the battery 20 in the first voltage the first voltage-dividing circuit 11 is higher than the output voltage V2 of the second constant-voltage circuit 13, the output voltage V4 of the comparator 15 exhibits a ground voltage.

The detection circuit 16 detects a decrease in the output voltage VB of the battery 20. A circuit including a central processing unit (CPU) or the like is used as the detection circuit 16. The output voltage Vi of the first voltage-dividing circuit 11, the output voltage V2 of the first constant-voltage circuit 12, and the output voltage V4 of the comparator 15 are input to the detection circuit 16. The output voltage V2 of the first constant-voltage circuit 12 is used as the power-supply voltage Vcc and the reference voltage Vref of the detection circuit 16. Furthermore, based on the output voltage V1 of the first voltage-dividing circuit 11, the output voltage V4 of the comparator 15, and the reference voltage Vref, the detection circuit 16 detects the decrease in the output voltage VB of the battery 20.

A detection voltage range of the detection circuit 16 is divided into a first voltage range on a higher-voltage region side and a second voltage range on a lower-voltage region side. The first voltage range is a voltage range in which the decrease in the output voltage VB of the battery 20 is small and the influence on the various devices connected to the battery 20 is small. The second voltage range is a voltage range in which the decrease in the output voltage VB of the battery 20 is large and the influence on the various devices connected to the battery 20 is large. The detection range will be described. The detection circuit 16 performs AD conversion on the value of the output voltage V1 of the first voltage-dividing circuit 11, and by calculation using the AD-converted value, calculates the output voltage V1 of the first voltage-dividing circuit 11. The reference voltage Vref is used as a reference value at the time of the calculation. Furthermore, the detection circuit 16 calculates the output voltage VB of the battery 20 from the output voltage V1 of the first voltage-dividing circuit 11 by proportional calculation.

As described above, the detection circuit 16 estimates the output voltage VB of the battery 20, based on the output voltage V1 of the first voltage-dividing circuit 11 and the reference voltage Vref. Furthermore, the detection circuit 16 determines whether or not the output voltage VB of the battery 20 is in the first voltage range, based on the estimated value of the output voltage VB of the battery 20. By this determination, the detection circuit 16 detects the decrease in the output voltage VB of the battery 20 in the first voltage range.

Next, a method for detecting a decrease in the output voltage VB of the battery 20 in the second voltage range will be described. In the first embodiment, the output voltage V1 of the first voltage-dividing circuit 11 and the output voltage V2 of the second constant-voltage circuit 13 are set in such a manner that the output voltage V4 of the comparator 15 exhibits a predetermined voltage value when the output voltage VB of the battery 20 is lower than or equal to the second threshold VB2 and that the output voltage V4 of the comparator 15 exhibits a ground voltage when the output voltage VB of the battery 20 is higher than the second threshold VB2. Furthermore, when the output voltage V4 of the comparator 15 is equal to the predetermined voltage value, the detection circuit 16 determines that the output voltage VB of the battery 20 is in the second voltage range, and when the output voltage V4 of the comparator 15 is not equal to the predetermined voltage value, the detection circuit 16 determines that the output voltage VB of the battery 20 is not in the second voltage range.

As described above, the detection circuit 16 determines whether or not the output voltage VB of the battery 20 is in the second voltage range, based on the output voltage V4 of the comparator 15. By this determination, the detection circuit 16 detects the decrease in the output voltage VB of the battery 20 in the second voltage range.

Information regarding a decrease in the output voltage VB of the battery 20 is transmitted to the control device 80 from the voltage detection device 10. Furthermore, the control device 80 performs various determinations regarding functions of the key-less entry system 1, based on the information acquired from the voltage detection device 10.

Next, functions of the key-less entry system 1 will be described. The key-less entry system 1 has a key-less function in which vehicle operations, such as locking and unlocking of the doors of the vehicle 90, are performed by using wireless communication between the in-vehicle communication device 30 and the portable device 40 without using a mechanical key, and an immobilizer function in which permission or non-permission for starting the engine with a mechanical key is determined by performing verification of ID information by using wireless communication between the in-vehicle communication device 30 and the portable device 40. The key-less entry system 1 may have functions other than the key-less function and the immobilizer function. However, in order to facilitate understanding of the description, in the first embodiment, the descriptions will be limited to the key-less function and the immobilizer function.

When performing an operation using the key-less function or the immobilizer function, wireless communication is performed between the in-vehicle communication device 30 and the portable device 40. The battery 20 supplies power to the in-vehicle communication device 30. Therefore, in a state in which the output voltage VB of the battery 20 has decreased, a circuit of the in-vehicle communication device 30 may not operate properly. Thus, there is a possibility that the wireless communication between the in-vehicle communication device 30 and the portable device 40 may not be performed. Furthermore, for example, the strength of transmission signals of the in-vehicle communication device 30 may decrease, and while verification of ID information or transmission and reception of signals regarding vehicle operation is being performed, there is a possibility that the verification of ID information or the transmission and reception of signals may be interrupted and therefore a defect in the operation of the system may be generated.

As a measure to avoid such a defect, a method for temporarily stopping a portion or all of the functions of the key-less entry system 1 before the circuit of the in-vehicle communication device 30 stops operating properly when the voltage VB of the battery 20 decreases, by detecting the output voltage VB of the battery 20 with the voltage detection device 10 at all times or on a regular basis, is effective. Functions that are subject to be stopped are the key-less function and the immobilizer function.

Even when the remaining amount of the battery 20 decreases, locking and unlocking of the doors of the vehicle 90 is possible with a mechanical key. Therefore, when the remaining amount of the battery 20 decreases, the influence on the operability is small even if the key-less function is stopped. Meanwhile, from the viewpoint of theft prevention of the vehicle 90, it is preferable that the immobilizer function is actuated up to the last minute even when the output voltage VB of the battery 20 decreases. Therefore, in the first embodiment, in the case where the output voltage VB of the battery 20 decreases, the control device 80 stops the functions of the key-less system 1 in stages, in conjunction with the degree of the decrease in the output voltage VB of the battery 20.

Figure 3:
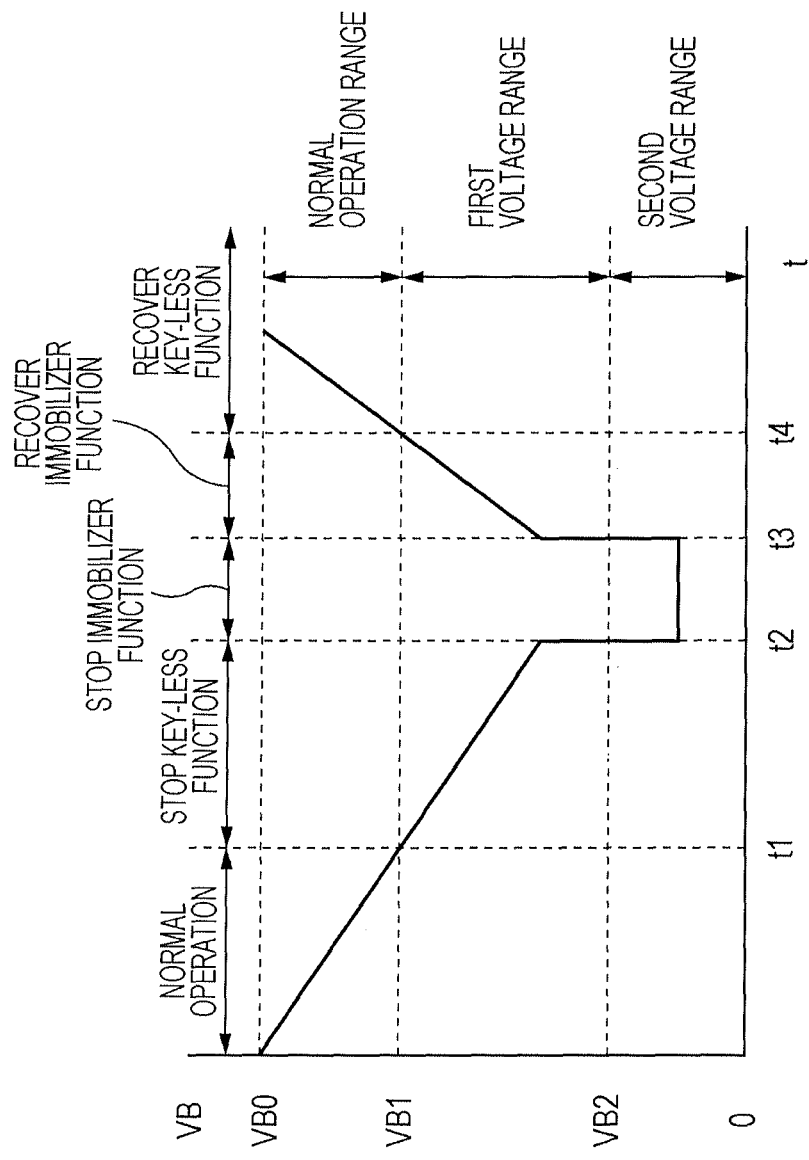
FIG. 3 is an explanatory diagram illustrating an example of variations in an output voltage of a battery according to the first embodiment of the present invention.

Next, a method for stopping the functions of the key-less entry system 1, in conjunction with the degree of a decrease in the output voltage VB of the battery 20, will be described, with reference to FIG. 3. FIG. 3 is an explanatory diagram illustrating an example of variations in the output voltage VB of the battery 20 according to the first embodiment of the present invention.

The example of variations illustrated in FIG. 3 schematically illustrates variations in the output voltage VB of the battery 20 in the case where, after a user leaves the vehicle 90 in a state in which the engine is stopped, the output voltage VB of the battery 20 gradually decreases and then recovers along with the start-up of the engine. In FIG. 3, the horizontal axis represents time t, and the vertical axis represents the output voltage VB of the battery 20. VB0 represents a voltage in a state where the output voltage VB of the battery 20 has not decreased. VB1 represents the first threshold (threshold for the normal operation range and the first voltage range). VB2 represents the second threshold (threshold for the first voltage range and the second voltage range).

In the example of variations illustrated in FIG. 3, when the user leaves the vehicle 90 unattended in a state in which the engine is stopped, the remaining amount of the battery 20 gradually decreases, and the output voltage VB of the battery 20 also gradually decreases from VB0. At a time t1, the output voltage VB of the battery 20 reaches a value lower than or equal to the first threshold VB1. After that, when the user re-enters the vehicle 90 and performs a cranking operation to start the engine of the vehicle 90, a large amount of power is consumed to actuate a motor for starting the engine. Thus, the output voltage VB of the battery 20 further decreases. At a time t2, the output voltage VB of the battery 20 reaches a value lower than or equal to the second threshold VB2.

After starting the engine, the motor for starting the engine stops. Thus, the output voltage VB of the battery 20 increases. At a time t3, the output voltage VB of the battery 20 becomes higher than the second threshold VB2. Furthermore, at or after the time t3, a power generator of the vehicle 90 starts to operate, and charging up of the battery 20 is performed. By this charging up, the output voltage VB of the battery 20 gradually increases. At a time t4, the output voltage VB of the battery 20 becomes higher than the first threshold VB1.

As a result, the output voltage VB of the battery 20 is in the normal operation range at and before the time t1, in the first voltage range during a period from the time t1 to the time t2, and in the second voltage range during a period from the time t2 to the time t3. Then, during a period from the time t3 to the time t4, the output voltage VB of the battery 20 is again in the first voltage range, and returns to the normal operation range at and after the time t4.

In the first embodiment, the control device 80 stops the functions of the key-less entry system 1 in stages in accordance with such variations in the output voltage VB of the battery 20. At the time in which the output voltage VB of the battery 20 decreases and enters the first voltage range (time t1), the control device 80 stops the key-less function. Then, at the time in which the output voltage VB of the battery 20 further decreases and enters the second voltage range (time t2), the control device 80 stops the immobilizer function. After that, at the time in which the output voltage VB of the battery 20 increases and enters the first voltage range (time t3), the control device 80 recovers the immobilizer function. Then, at the time in which the output voltage VB of the battery 20 further recovers and enters the normal operation range (time t4), the control device 80 recovers the key-less function. Thus, all the functions of the key-less entry system 1 start to operate, and the normal operation commences.

In the case where the decrease in the output voltage VB of the battery 20 is small and the output voltage VB of the battery 20 does not enter the second voltage range, the immobilizer function will not be stopped. Furthermore, in the case where, the decrease in the output voltage VB of the battery 20 is much smaller and does not enter the first voltage range, the key-less function will not be stopped.

Figure 4:
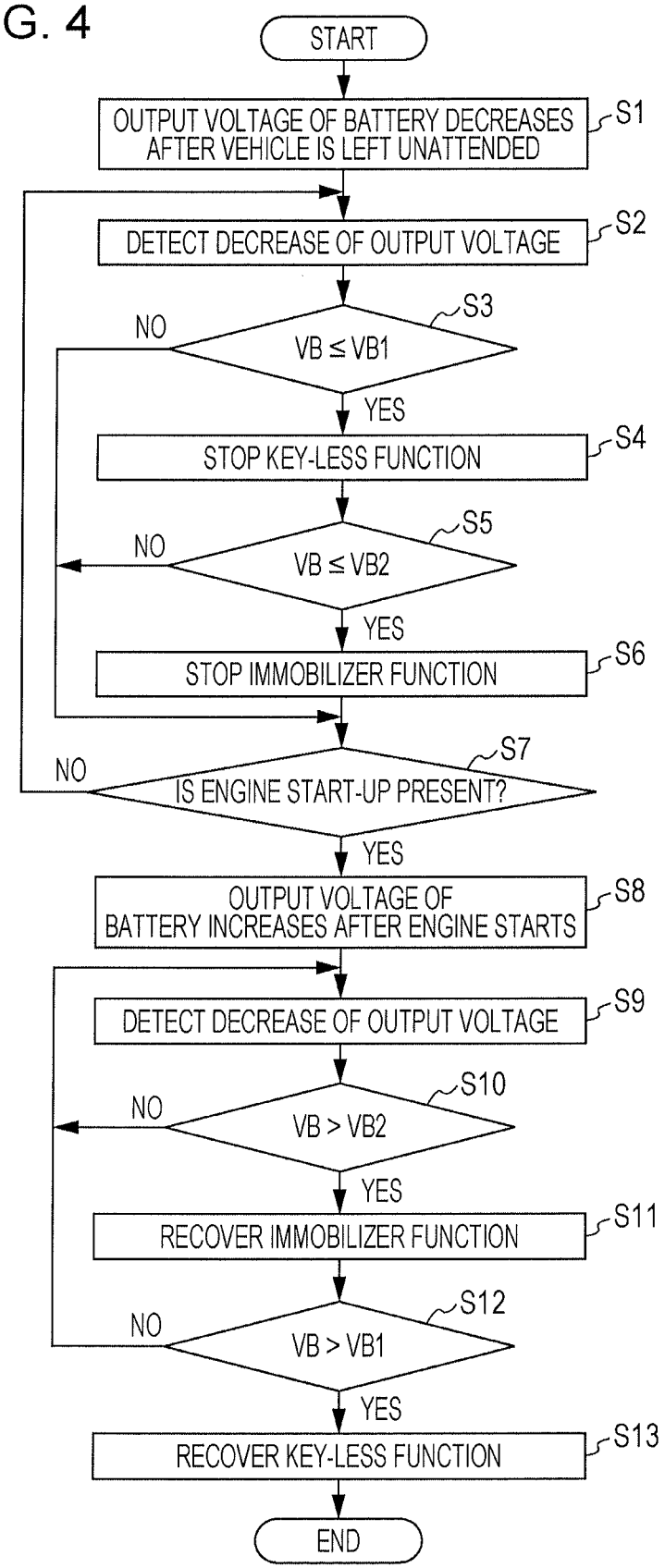
FIG. 4 is a flowchart illustrating a process for stopping and recovering functions according to the first embodiment of the present invention.

Next, a process for stopping and recovering the functions of the key-less entry system 1 according to the first embodiment of the present invention will be described, with reference to FIG. 4. FIG. 4 is a flowchart illustrating the process for stopping and recovering the functions according to the first embodiment of the present invention. The process illustrated in FIG. 4 illustrates the process for stopping and recovering the functions of the key-less entry system 1 in the case where, after a user leaves the vehicle 90 in a state in which the engine is stopped, the output voltage VB of the battery 20 gradually decreases and then recovers along with the start-up of the engine.

As illustrates in FIG. 4, when the user leaves the vehicle 90 unattended in the state in which the engine is stopped, the output voltage VB of the battery 20 gradually decreases (step S1). The voltage detection device 10 detects the decrease in the output voltage VB of the battery 20 (step S2).

Based on the degree of the decrease in the output voltage VB of the battery 20, the control device 80 performs a first determination regarding stopping of a function (step S3). If the output voltage VB of the battery 20 is lower than or equal to the first threshold voltage VB1 in step S3, the control device 80 stops the key-less function (step S4). Then, the process proceeds to step S5. If the output voltage VB of the battery 20 is higher than the first threshold voltage VB1 in step S3, the process proceeds to step S7.

In step S5, based on the degree of the decrease in the output voltage VB of the battery 20, the control device 80 performs a second determination regarding stopping of a function. If the output voltage VB of the battery 20 is lower than or equal to the second threshold voltage VB2 in step S5, the control device 80 stops the immobilizer function (step S6). Then, the process proceeds to step S7. When the output voltage VB of the battery 20 is higher than the second threshold voltage VB2 in step S5, the process proceeds to step S7.

In step S7, the control device 80 performs determination based on presence or absence of engine start-up. When engine start-up is not present in step S7, the process returns to step S2, and repeats the processing from step S2 to step S7. When engine start-up is present in step S7, the process proceeds to step S8.

The processing from step S2 to step S7 may include a case in which the user re-enters the vehicle 90 and the cranking operation for starting the engine of the vehicle is performed. In the case where the cranking operation is performed, the output voltage VB of the battery 20 rapidly decreases. The processing for stopping the functions of the key-less entry system 1 in stages according to the decrease in the output voltage VB of the battery 20 is the same as the processing from step S2 to step S7.

Next, in step S8, the output voltage VB of the battery 20 increases following the engine start-up of the vehicle 90 (step S8). Then, the voltage detection device 10 detects the decrease in the output voltage VB of the battery 20 (step S9).

Next, based on the degree of the decrease in the output voltage VB of the battery 20, the control device 80 performs a first determination regarding recovery of a function (step S10). If the output voltage VB of the battery 20 is lower than or equal to the second threshold voltage VB2 in step S10, the process returns to step S9, and repeats the processing from step S9 to step S10. In the case where the output voltage VB of the battery 20 recovers and becomes higher than the second threshold voltage VB2 in step S10, the control device 80 recovers the immobilizer function (step S11). Then, the process proceeds to step S12.

In step S12, based on the degree of the decrease in the output voltage VB of the battery 20, the control device 80 performs a second determination regarding recovery of a function. If the output voltage VB of the battery 20 is lower than or equal to the first threshold voltage VB1 in step S12, the process returns to step S9, and repeats the processing from step S9 to step S12. In the case where the output voltage VB of the battery 20 recovers and becomes higher than the first threshold voltage VB1 in step S12, the control device 80 recovers the key-less function (step S13).

As described above, the key-less entry system 1 according to the first embodiment avoids a defect in the system by stopping the functions of the key-less system 1 in stages before the circuit of the in-vehicle communication device 30 stops operating properly, in the case where the output voltage VB of the battery 20 decreases. Furthermore, along with the recovery of the output voltage VB of the battery 20, the functions of the key-less entry system 1 recover in stages.

Next, effects attained in the first embodiment will be described. Firstly, a case will be described in which the voltage detection device 10 according to the first embodiment does not include the second constant-voltage circuit 13 and the comparator 15 and in which the detection circuit 16 detects a decrease in the output voltage VB of the battery 20, based only on the output voltage V1 of the first voltage-dividing circuit 11 and the output voltage V2 of the first constant-voltage circuit 12. In such a case, when the output voltage VB of the battery 20 largely decreases to a value near the reference voltage Vref, the first constant-voltage circuit 12 cannot maintain a specific output voltage, and starts to output a voltage which is lower than the original reference voltage Vref. As a result, the detection circuit 16 starts to estimate the output voltage VB of the battery 20, based on the voltage lower than the reference voltage Vref. Therefore, the decrease in the output voltage VB of the battery 20 cannot be detected correctly. The output voltage V2 of the first constant-voltage circuit 12 is also used as the power-supply voltage Vcc of the detection circuit 16. The power-supply voltage Vcc of the detection circuit 16 needs to be set within a range in which the detection circuit 16 operates properly. Thus, it is difficult to set the output voltage V2 of the first constant-voltage circuit 12 at a low value in preparation for the case in which the output voltage VB of the battery 20 largely decreases.

In contrast, the voltage detection device 10 according to the first embodiment includes the second constant-voltage circuit 13 and the comparator 15. The second constant-voltage circuit 13 converts the output voltage VB of the battery 20 into the predetermined voltage V3, which is lower than the output voltage V2 of the first constant-voltage circuit 12. The comparator 15 compares the output voltage V1 of the first voltage-dividing circuit 11 with the output voltage V3 of the second constant-voltage circuit 13. The second constant-voltage circuit 13 is a circuit, which generates the comparison voltage, which is to be input to the comparator 15, and is not intended to supply power to another circuit. Therefore, the output voltage V3 of the second constant-voltage circuit 13 may be set at a low value in preparation for a case in which the output voltage VB of the battery 20 largely decreases. Thus, compared to the output voltage V2 of the first constant-voltage circuit 12, the output voltage V3 of the second constant-voltage circuit 13 is less susceptible to the influence of the decrease in the output voltage VB of the battery 20. Furthermore, the output voltage V1 of the first voltage-dividing circuit 11 varies in proportion to the output voltage VB of the battery 20. Therefore, by the comparison between the output voltage V1 of the first voltage-dividing circuit 11 and the output voltage V3 of the second constant-voltage circuit 13 by the comparator 15, even in the case where the output voltage VB of the battery 20 largely decreases, it is possible to detect the decrease in the output voltage VB of the battery 20.

Furthermore, in the voltage detection device 10 according to the first embodiment, the second constant-voltage circuit 13 is a circuit, which is provided only for generating the comparison voltage to be input to the comparator 15, and the output voltage of the second constant-voltage circuit 13, is not used as a power-supply voltage for another circuit. Therefore, the circuit configuration may be relatively simple. For example, as illustrated in FIG. 2, the second constant-voltage circuit 13 may include a small number of components, including the resistive element R3, the resistive element R4, and the Zener diode D1. Thus, it is possible to simplify the circuit configuration. As a result, the circuit configuration of the voltage detection device 10 may be simplified.

In a second embodiment, when a configuration is the same as the configuration described in the first embodiment, the same reference signs will be used, and the detailed description thereof will be omitted.

Figure 5:
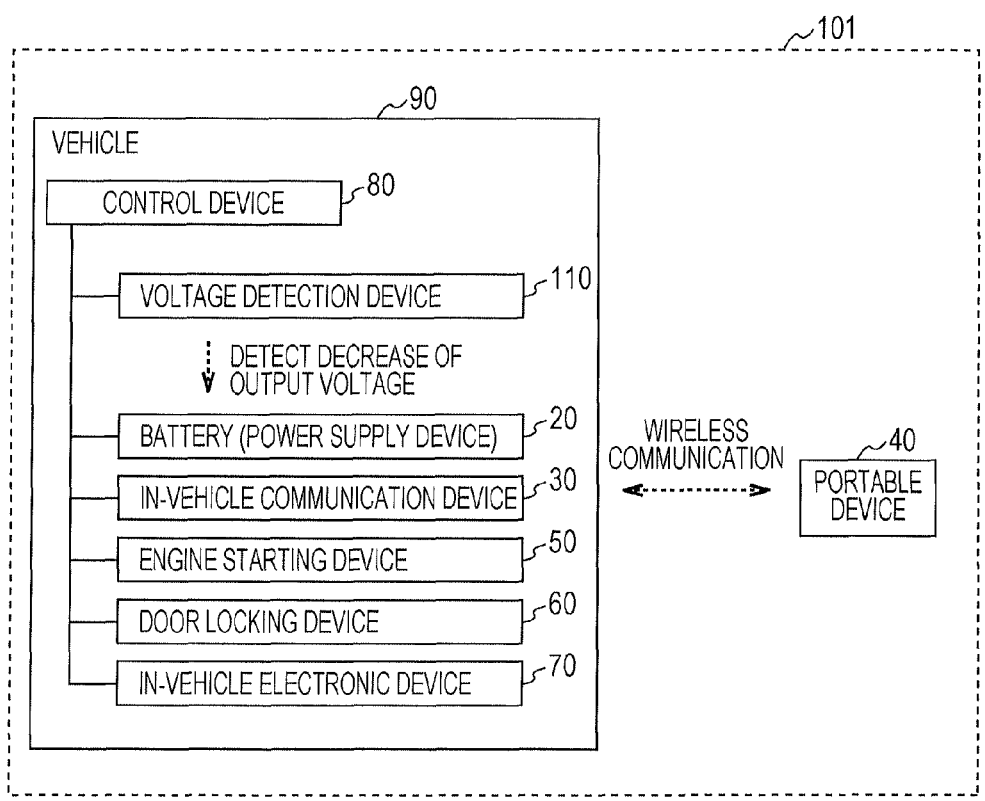
FIG. 5 is an explanatory diagram illustrating a configuration of a key-less entry system according to a second embodiment of the present invention.
Figure 6:
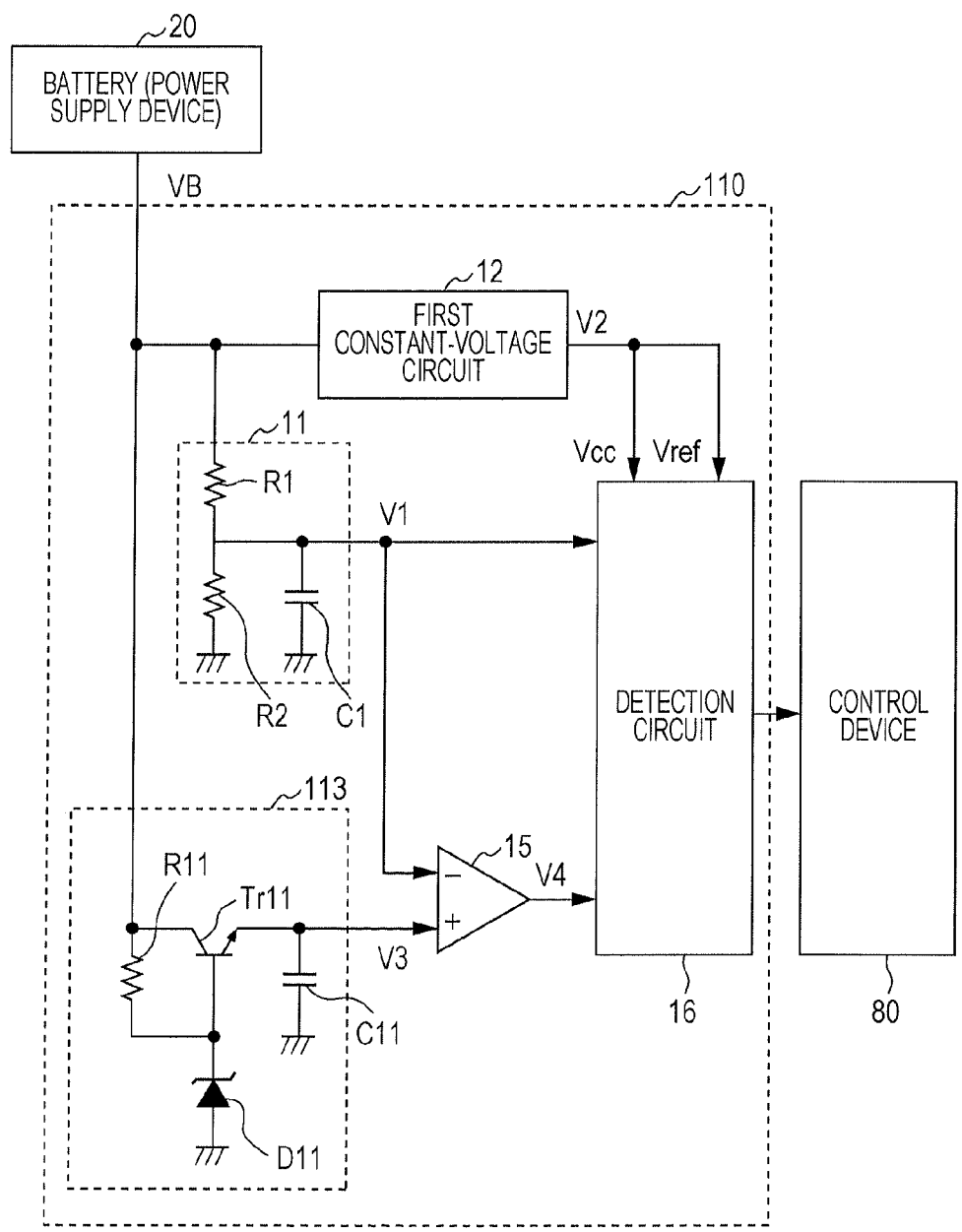
FIG. 6 is a circuit diagram illustrating a configuration of a voltage detection device illustrated in FIG. 5.
Figure 7:
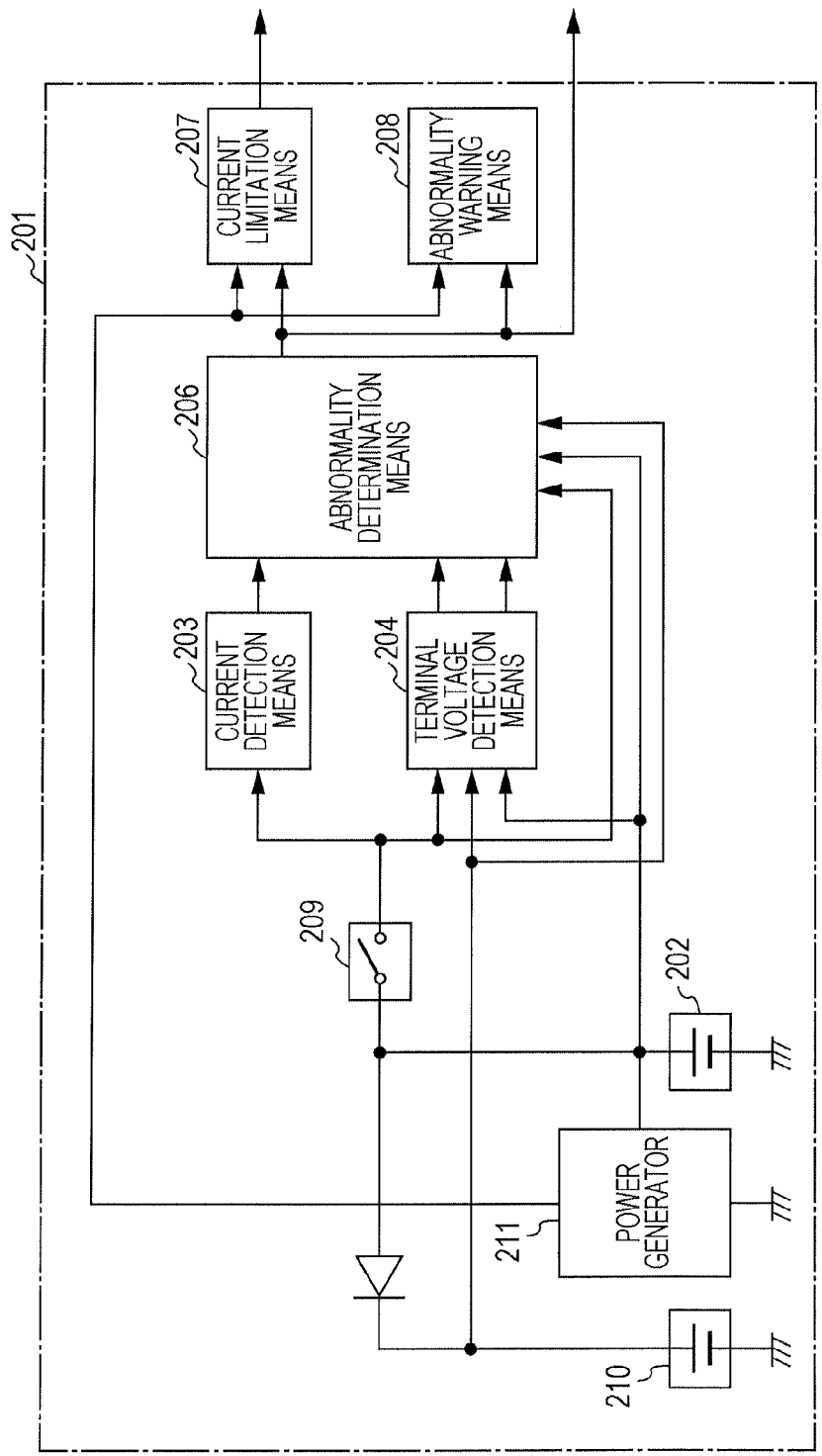
FIG. 7 is an explanatory diagram illustrating a configuration of a power diagnostic device for a vehicle according to Japanese Unexamined Patent Application Publication No. 2000-206215.
Figure 8:
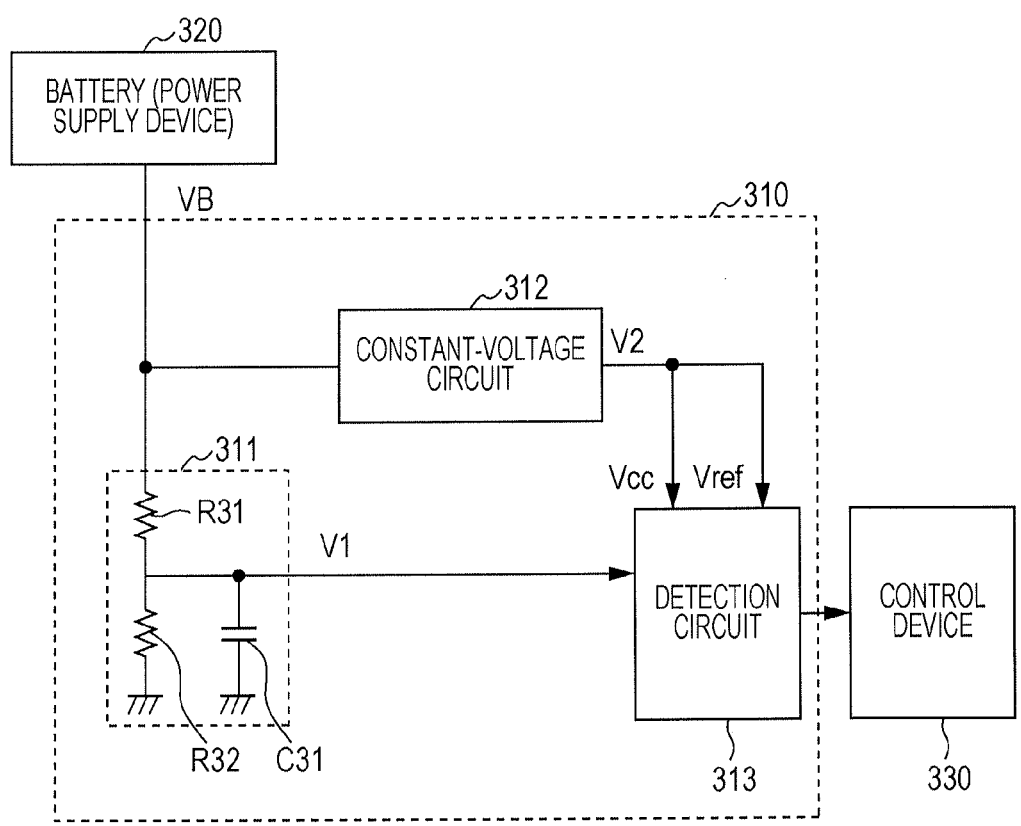
FIG. 8 is an explanatory diagram illustrating a circuit configuration of a conventional voltage detection device.

Firstly, a configuration of a voltage detection device 110 according to the second embodiment will be described, with reference to FIG. 5 and FIG. 6. FIG. 5 is an explanatory diagram illustrating a configuration of a key-less system 101 according to the second embodiment of the present invention. FIG. 6 is a circuit diagram illustrating a configuration of the voltage detection device 110 illustrated in FIG. 5.

The key-less entry system 101 according to the second embodiment is, as illustrated in FIG. 5, a key-less entry system in which the voltage detection device 10 of the key-less entry system 1 according to the first embodiment is replaced with the voltage detection device 110. As illustrated in FIG. 6, the voltage detection device 110 includes a first voltage-dividing circuit 11, a first constant-voltage circuit 12, a second constant-voltage circuit 113, a comparator 15, and a detection circuit 16. The voltage detection device 110 of the second embodiment is a voltage detection device in which the second constant-voltage circuit 13 of the voltage detection device 10 according to the first embodiment is replaced with the second constant-voltage circuit 113.

The second constant-voltage circuit 113 includes a resistive element R11, a transistor Tr11, a Zener diode D11, and a ground capacitance C11. The transistor Tr11 is an NPN-type bipolar transistor. The collector of the transistor Tr11 is connected to the output terminal of the battery 20. The resistive element R11 is connected between the collector and the base of the transistor Tr11. The cathode side of the Zener diode D11 is connected to the base of the transistor Tr11, and the anode side of the Zener diode D11 is grounded. Furthermore, the emitter of the transistor Tr11 is an output terminal. The ground capacitance C11 is connected to the output terminal of the second constant-voltage circuit 113. The ground capacitance C11 is a capacitance to eliminate noise.

Even with the second constant-voltage circuit 113 having the circuit configuration described above, similar to the second constant-voltage circuit 13 in the first embodiment, it is possible to convert the output voltage VB of the battery 20 into a predetermined voltage V3, which is lower than an output voltage V2 of the first constant-voltage circuit 12. Therefore, even with the voltage detection device 110 according this embodiment, it is possible to achieve an effect similar to the voltage detection device 10 according to the first embodiment.

Embodiments of the present invention have been described above. However, the present invention is not limited to the above-described embodiments, and it may be appropriately modified without departing from the scope of the present invention.

For example, in an embodiment of the present invention, the first voltage-dividing circuit 11 may have a circuit configuration different from the first voltage-dividing circuit 11 illustrated in FIG. 2. Furthermore, the first constant-voltage circuit 12 may not need to be a circuit which includes a regulator IC. The first constant-voltage circuit 12 may be a circuit formed by combining various electronic components.

Furthermore, in an embodiment of the present invention, the second constant-voltage circuit may have a circuit configuration different from the second constant-voltage circuit 13 illustrated in FIG. 2 or the second constant-voltage circuit 113 illustrated in FIG. 6, as long as the second constant-voltage circuit is able to convert the output voltage VB of the battery 20 into the predetermined voltage V3.

Furthermore, in an embodiment of the present invention, in the case where the influence of the noise generated from the first constant-voltage circuit 12, the second constant-voltage circuit 13, or the second constant-voltage circuit 113 is small, the ground capacitance C1, the ground capacitance C2, or the ground capacitance C11 may not need to be provided.

Furthermore, in an embodiment of the present invention, in the case where the output voltage VB of the battery 20 decreases and enters the second voltage range, the detection circuit 16 may estimate the output voltage VB of the battery 20 approximately from the output voltage V1 of the first voltage-dividing circuit 11 and perform more detailed control of the stopping and the recovering of the functions of the key-less entry system 1, based on the output voltage V4 of the comparator 15 and the estimated value of the output voltage VB of the battery 20.

Furthermore, in an embodiment of the present invention, the key-less function may include functions of performing locking and unlocking of a trunk, opening and closing of windows, turning on and off of lights, and the like without using a mechanical key. Moreover, in the case where the output voltage VB of the battery 20 decreases and enters the first voltage range, the above-mentioned functions may be stopped at the same time as stopping of the function of performing locking and unlocking of the doors without using a mechanical key.

Furthermore, in an embodiment of the present invention, a function which stops when the output voltage VB of the battery 20 enters the first voltage range and a function which stops when the output voltage VB of the battery 20 enters the second voltage range may be modified appropriately according to standards and specifications of the system. Moreover, in the case where the key-less function includes the functions of locking and unlocking a trunk, opening and closing windows, turning on and off lights, and the like without using a mechanical key, a portion of these functions may be stopped at the time in which the output voltage VB of the battery 20 enters the second voltage range, instead of the time in which the output voltage VB of the battery 20 enters the first voltage range.

Furthermore, in an embodiment of the present invention, the determination regarding stopping of a function and the determination regarding recovery of a function may not need to be performed separately. The determination as to stopping of a function and the determination as to recovery of a function may be performed simultaneously, based on the degree of the decrease in the output voltage VB of the battery 20.

Furthermore, in an embodiment of the present invention, the voltage detection device 10 or the voltage detection device 110 may detect an output voltage of a power supply circuit connected to the battery 20, instead of the output voltage of the battery 20. Moreover, a power supply device mounted on the vehicle 90 may be a power supply device different from the battery 20. In addition, the voltage detection device 10 or the voltage detection device 110 may detect an output voltage of the power supply device different from the battery 20.

Furthermore, in an embodiment of the present invention, the voltage detection device 10 or the voltage detection device 110 may be used as a voltage detection device of a vehicle system different from the key-less entry system.

What is claimed is:

1. A voltage detection device configured to be connected to a power supply device of a vehicle and to detect a decrease in an output voltage of the power supply device, the voltage detection device comprising:

a first voltage-dividing circuit configured to divide the output voltage of the power supply device with a predetermined ratio;

a first constant-voltage circuit configured to convert the output voltage of the power supply device into a predetermined voltage;

a second constant-voltage circuit configured to convert the output voltage of the power supply device into a predetermined voltage, which is lower than an output voltage of the first constant-voltage circuit;

a comparator configured to receive an output voltage of the first voltage-dividing circuit and an output voltage of the second constant-voltage circuit; and a detection circuit configured to receive the output voltage of the first voltage-dividing circuit, the output voltage of the first constant-voltage circuit, and an output voltage of the comparator and to detect the decrease in the output voltage of the power supply device, wherein the detection circuit detects a decrease in the output voltage of the power supply device in a higher-voltage region of a detection voltage range of the detection circuit, based on the output voltage of the first voltage-dividing circuit and the output voltage of the first constant-voltage circuit, and the detection circuit detects a decrease in the output voltage of the power supply device in a lower-voltage region of the detection voltage range of the detection circuit, based on the output voltage of the comparator.

2. The voltage detection device according to claim 1, wherein the second constant-voltage circuit incudes:

a second voltage-dividing circuit including two resistive elements connected in series and to divide the output voltage of the power supply device with a predetermined ratio; and a Zener diode having one end connected to an output terminal of the second voltage-dividing circuit and the other end connected to a ground.

* * * * *